United States Patent
Park

(10) Patent No.: US 8,274,609 B2
(45) Date of Patent: Sep. 25, 2012

(54) METHOD OF TUNING ACCORDING TO VARYING LENGTH OF KEY INPUT AND BROADCAST RECEIVING APPARATUS USING THE SAME

(75) Inventor: Jung-kil Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1343 days.

(21) Appl. No.: 11/723,002

(22) Filed: Mar. 15, 2007

(65) Prior Publication Data

US 2008/0098435 A1    Apr. 24, 2008

(30) Foreign Application Priority Data

Oct. 20, 2006 (KR) .................. 10-2006-0102451

(51) Int. Cl.
*H04N 5/50* (2006.01)
*H04N 5/44* (2011.01)

(52) U.S. Cl. ...................... 348/734; 348/731
(58) Field of Classification Search .......... 348/731, 348/725, 705, 706, 554, 555, 734; 725/37, 725/38, 48, 56, 59
See application file for complete search history.

(56) References Cited

U.S. PATENT DOCUMENTS

| | | | | |
|---|---|---|---|---|
| 6,115,080 A * | 9/2000 | Reitmeier | ...................... | 348/731 |
| 6,636,273 B1 * | 10/2003 | Weber | ........................... | 348/734 |
| 6,707,508 B1 * | 3/2004 | Mears et al. | .................. | 348/731 |
| 6,766,526 B1 * | 7/2004 | Ellis | ................................ | 725/57 |
| 7,154,564 B2 * | 12/2006 | Kim | ................................ | 348/731 |
| 7,412,715 B2 * | 8/2008 | Kim et al. | ........................ | 725/38 |
| 7,688,389 B2 * | 3/2010 | Takagi et al. | ................. | 348/731 |
| 2001/0054183 A1 * | 12/2001 | Curreri | ........................... | 725/56 |
| 2002/0051092 A1 * | 5/2002 | Kim | ................................ | 348/731 |
| 2003/0133050 A1 * | 7/2003 | Shintani et al. | ............... | 348/734 |
| 2004/0049782 A1 * | 3/2004 | Shintani et al. | ................. | 725/38 |
| 2004/0189879 A1 * | 9/2004 | Read | ................................ | 348/731 |
| 2005/0204385 A1 * | 9/2005 | Sull et al. | ........................ | 725/45 |
| 2008/0022346 A1 * | 1/2008 | Mears et al. | .................. | 725/131 |

FOREIGN PATENT DOCUMENTS

KR    2002-0076597 A    10/2002
KR    10-2005-0122861 A    12/2005

* cited by examiner

*Primary Examiner* — Victor Kostak

(74) *Attorney, Agent, or Firm* — Sughrue Mion, PLLC

(57) ABSTRACT

Provided are a tuning method according to a variable key input length and a broadcast receiving apparatus using the tuning method. The tuning method includes: if it is determined that an input length of one of at least one or more key inputs is more than or equal to a predetermined time, tuning to a first type broadcast; and if it is determined that the input length is less than the predetermined time, tuning to a second type broadcast different from the first type broadcast. Thus, different types of broadcasts can be tuned according to a length of a key input performed by a user. As a result, a digital broadcast channel can be directly input using only a number key.

44 Claims, 6 Drawing Sheets

METHOD OF TUNING ACCORDING TO VARYING LENGTH OF KEY INPUT AND BROADCAST RECEIVING APPARATUS USING THE SAME

CROSS-REFERENCE TO RELATED APPLICATIONS

This application claims priority from Korean Patent Application No. 10-2006-102451 filed Oct. 20, 2006, in the Korean Intellectual Property Office, the entire disclosure of which is incorporated herein by reference.

BACKGROUND OF THE INVENTION

1. Field of the Invention

Apparatuses and methods consistent with the present invention relate to a broadcast tuning, and more particularly, to tuning to different types of broadcast according to varying lengths of key input as determined by a user.

2. Description of the Related Art

A digital broadcast channel is expressed with a combination of major and minor channels. For example, from a digital broadcast channel "7-2," "7" is a major channel, and "2" is a minor channel.

As described above, a digital broadcast channel uses a different expression method from an analog broadcast channel. Thus, desired digital and analog broadcast channels may be respectively input using different methods. A method of inputting a digital broadcast channel will now be described with reference to FIG. 1.

FIG. 1 illustrates keys provided in a digital television (TV) remote controller. Referring to FIG. 1, different from an existing analog TV remote controller, the digital TV remote controller includes keys "-" and "DTV." The keys "-" and "DTV" are used to input a desired digital broadcast channel.

A user must input a number key "7," the key "-", and then a number key "2" to input a digital broadcast channel "7-2" using the key "-." In the case of an input using the key "-," a procedure of inputting the key "-" besides a number key must be performed. Thus, there is an increase of the number of times the keys are input. This is inconvenient to the user.

The user may sequentially increase digital broadcast channels one by one using the key "DTV." This provides a convenience of a single key input to the user for a sequential channel changing method. However, the user cannot immediately move to a desired channel. In particular, if there are a large number of digital broadcast channels, this input method is difficult in practical use.

In addition, the keys "-" and "DTV" causes the size of the digital TV remote controller to be increased and make the manipulation of the digital TV remote controller difficult.

SUMMARY OF THE INVENTION

Exemplary embodiments of the present invention overcome the above disadvantages and other disadvantages not described above.

The present invention provides a method of direct broadcast tuning by a simple key input without requiring an additional key input, which tunes to different types of broadcast according to varying length of key input as determined by a user, and a broadcast receiving apparatus using the method.

An aspect of the present invention provides a tuning method which may comprise conducting a first tuning in which a first type broadcast is tuned, if it is determined that one of at least one or more key inputs lasts a predetermined time period or longer, and conducting a second tuning in which a second type broadcast is tuned, if it is determined that the at least one or more key inputs last less than the predetermined time period.

The first type broadcast comprises a digital broadcast.

The key inputs may be inputs of number keys, and the first tuning may comprise tuning to a major channel corresponding to a first number which is input through at least one of the number keys for the first predetermined time period or longer.

The first tuning may comprise tuning to one of minor channels of the major channel, which corresponds to a second number input through at least one of the number keys after the first number.

In order to tune to a digital channel, the key corresponding to the last numbered digit of the first number (single key if the first number is a single digit number) is input for a time period longer than the first predetermined time to indicate to the receiver that the desired channel is a digital channel and that all of the digits of the major channel number have been input.

Upon recognition of the major channel number of the desired digital channel, the receiver may display an indication in the screen to inform the user to input the minor channel number. The indication may simply be a "dash" or any other indication suitable for informing the user that an input of a digital channel has been recognized by the receiver. Furthermore, the receiver may display a list of available minor channels corresponding to the selected major channel number. Accordingly, the user may simply use the navigation keys, such as "up" and "down" keys of the remote controller, to select the desired minor channel number. The major channel number input by the user may be compared with the pre-stored available major channel numbers in the memory device of the receiver to ascertain whether the input major channel number is a valid major channel number. Similarly, the list of available minor channel numbers corresponding to the input major channel number may be retrieved from the memory device having the pre-stored minor channel numbers that are associated with the various different major channel numbers. The available major channel numbers and the minor channels numbers may be pre-stored in the memory device upon actuation of the automatic channel searching function found in the conventional broadcast receiver devices or may be detected by utilizing the program information sent with the broadcast.

Various other ways to initiate the tuning process may be used. In one first method, the user does not input any additional keys and the receiver tunes to the first minor channel after a timeout period. That is, the expiration of the timeout period in which the user does not input any keys is an indication that the user has finished inputting all of the numbers of the desired channel number. In another method, if the last digit of the major channel number is input for a duration longer than a second predetermined time, the second predetermined time being longer than the first predetermined time, the receiver may immediately tune to the first minor channel corresponding to the major channel number. Above two methods may be utilized without resorting to the detected information regarding the availability of the minor channels within a particular major channel and the receiver need not tune into the first minor channel. Another minor channel may be designated instead of the first minor channel. If the desired major channel is a single program channel, such as the case when the desired channel is broadcasting a single HD program which occupies the entire bandwidth of the channel, the receiver may immediately tune to the single minor channel of the corresponding major channel. The third method may check whether the currently selected major channel includes a plurality of minor channels, if not, the tuning would be performed immediately to the single minor channel number. In this case, there would be no need for the receiver to wait for the timeout period before initiating the tuning process. The checking of the availability of the minor channels may be performed by utilizing information which was stored during an automatic channel searching function or by utilizing the program information sent with the broadcast, such as the PSIP (Program system information protocol) of the U.S. digital broadcast standard.

The second type broadcast may comprise an analog broadcast which is selected when none of the number keys corresponding to the first number is input for the first predetermined time period or longer.

The first type broadcast may comprise one of terrestrial, cable, IPTV and satellite broadcasts, the second type broadcast may comprise one of terrestrial, cable and satellite broadcasts, and the first and the second type broadcast may be different from each other.

Another aspect of the present invention provides a broadcast receiving apparatus comprising: a broadcast receiver which tunes to and receives a broadcast, and a controller which controls the broadcast receiver such that a first type broadcast is tuned, if it is determined that one of at least one or more key inputs lasts a predetermined time period or longer, and a second type broadcast is tuned, if it is determined that the at least one or more key inputs last less than the predetermined time period, wherein the second type broadcast is different from the first type broadcast.

The first type broadcast may comprise a digital broadcast.

The key inputs may be inputs of number keys, and the controller may control the broadcast receiver to tune to a major channel corresponding to a first number which is input through at least one of the number keys for the first predetermined time period or longer.

The controller may control the broadcast receiver such that one of minor channels of the major channel, which corresponds to a second number which is input through at least one of the number keys after the first number key, is tuned.

In order to tune to a digital channel, the key corresponding to the last numbered digit of the first number (single key if the first number is a single digit number) is input for a time period longer than the first predetermined time to indicate to the receiver that the desired channel is a digital channel and that all of the digits of the major channel number have been input.

Upon recognition of the major channel number of the desired digital channel, the receiver may display an indication in the screen to inform the user to input the minor channel number. The indication may simply be a "dash" or any other indication suitable for informing the user that an input of a digital channel has been recognized by the receiver. Furthermore, the receiver may display a list of available minor channels corresponding to the selected major channel number. Accordingly, the user may simply use the navigation keys, such as "up" and "down" keys of the remote controller, to select the desired minor channel number. The major channel number input by the user may be compared with the pre-stored available major channel numbers in the memory device of the receiver to ascertain whether the input major channel number is a valid major channel number. Similarly, the list of available minor channel numbers corresponding to the input major channel number may be retrieved from the memory device having the pre-stored minor channel numbers that are associated with the various different major channel numbers. The available major channel numbers and the minor channels numbers may be pre-stored in the memory device upon actuation of the automatic channel searching function found in the conventional broadcast receiver devices or may be detected by utilizing the program information sent with the broadcast.

The controller controls the receiver to implement various other ways to initiate the tuning process. In one method, the user does not input any additional keys and the receiver tunes to the first minor channel after a timeout period. That is, the expiration of the timeout period in which the user does not input any keys is an indication that the user has finished inputting all of the numbers of the desired channel number. In another method, if the last digit of the major channel number is input for a duration longer than a second predetermined time, the second predetermined time being longer than the first predetermined time, the receiver may immediately tune to the first minor channel corresponding to the major channel number. Above two methods may be utilized without resorting to the detected information regarding the availability of the minor channels within a particular major channel and the receiver need not tune into the first minor channel. Another minor channel may be designated instead of the first minor channel. If the desired major channel is a single program channel, such as the case when the desired channel is broadcasting a single HD program which occupies the entire bandwidth of the channel, the receiver may immediately tune to the single minor channel of the corresponding major channel. The third method may check whether the currently selected major channel includes a plurality of minor channels, if not, the tuning would be performed immediately to the single minor channel number. In this case, there would be no need for the receiver to wait for the timeout period before initiating the tuning process. The checking of the availability of the minor channels may be performed by utilizing information which was stored during an automatic channel searching function or by utilizing the program information sent with the broadcast, such as the PSIP (Program system information protocol) of the U.S. digital broadcast standard.

The second type broadcast may comprise an analog broadcast.

A combiner may further be provided, for overlapping display information on a screen to be displayed. The controller may control the combiner such that the list of minor channels belonging to the major channel is overlapped on the screen.

The controller may control the broadcast receiver such that a minor channel, which is selected by a user from the list of minor channels, is tuned.

The first type broadcast may comprise one of terrestrial, cable, IPTV and satellite broadcasts, the second type broadcast comprises one of terrestrial, cable, IPTV and satellite broadcasts, and the first and the second type broadcast are different from each other.

Another aspect of the present invention provides a tuning method comprising: receiving an input of a first number key for a predetermined time period or longer, receiving an input of a second number key after the input of the first number key, and tuning a minor channel corresponding to a second number input through the second number key, wherein the minor channel is one of minor channels belonging to a major channel corresponding to a first number input through the first number key.

Yet another aspect of the present invention provides a tuning method comprising: determining a length of input time of each of at least one or more key inputs, determining the at least one key inputs as a command to tune to a first type broadcast, if it is determined that one of the at least one or more key inputs is input for a predetermined time period or longer, and determining the at least one key inputs as a command to tune to a second type broadcast which is different from the first type broadcast, if it is determined that the each of the at least one or more key inputs is input less than the predetermined time period.

The first type broadcast may comprise a digital broadcast, and the second type broadcast may comprise an analog broadcast.

Yet another aspect of the present invention provides a tuning method comprising: determining a length of time that a key is input, and determining that the key input is for inputting a major channel, if it is determined that the key is input for a predetermined time or longer.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF THE EXEMPLARY EMBODIMENTS

Figure 1:
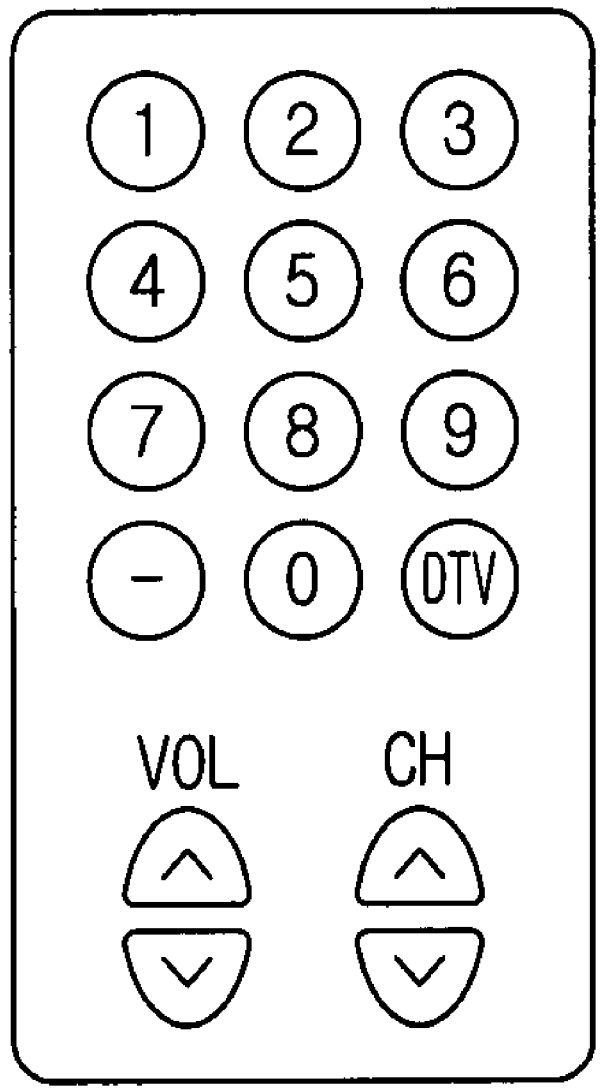
FIG. 1 illustrates keys provided in a digital TV remote controller.

Certain exemplary embodiments of the present invention will now be described in greater detail with reference to the accompanying drawings.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they would obscure the invention in unnecessary detail.

Figure 2:
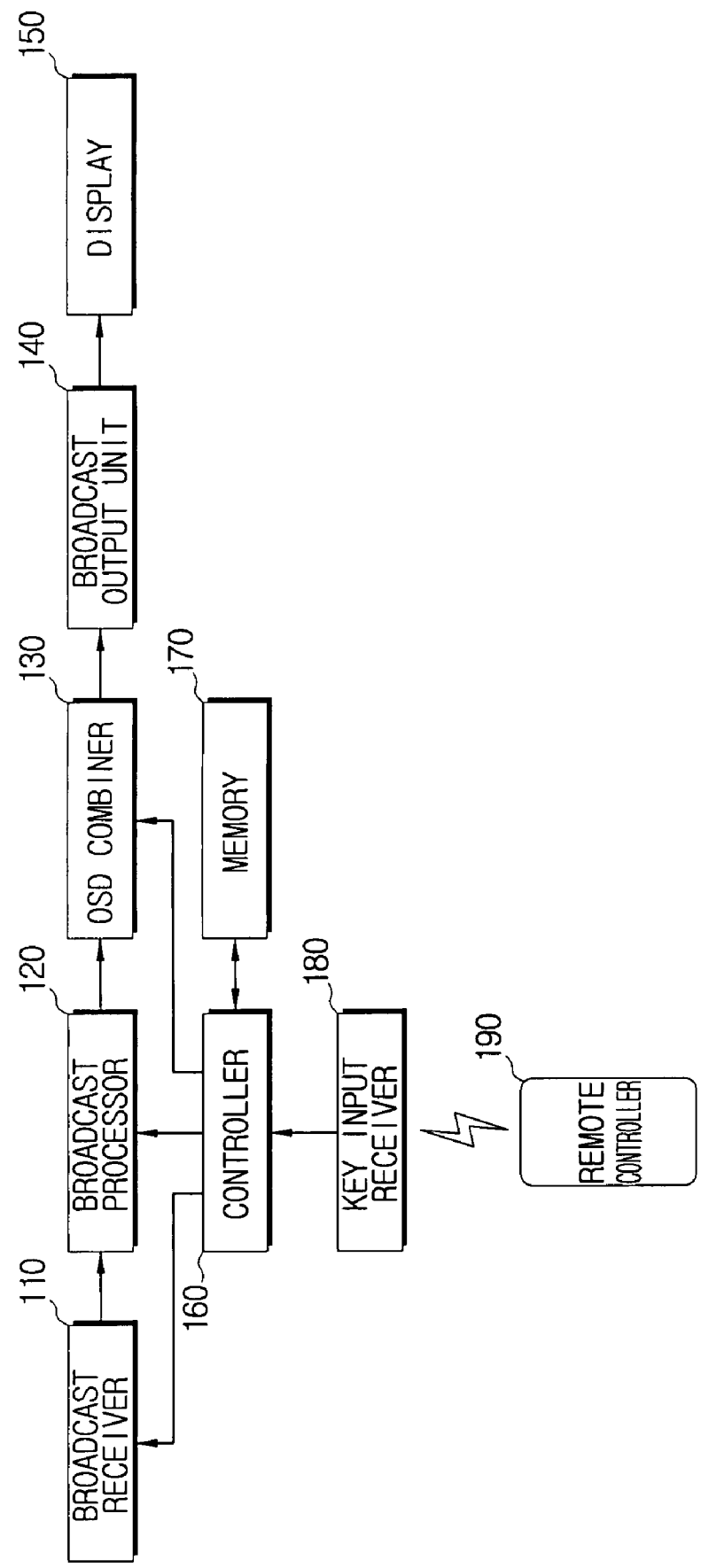
FIG. 2 is a block diagram of a broadcast receiving apparatus according to an embodiment of the present invention.

FIG. 2 is a block diagram of a broadcast receiving apparatus according to an embodiment of the present invention. The broadcast receiving apparatus shown in FIG. 2 tunes broadcasts using different methods according to a variable key input length determined by a user.

Referring to FIG. 2, the broadcast receiving apparatus includes a broadcast receiver 110, a broadcast processor 120, an on-screen display (OSD) combiner 130, a broadcast output unit 140, a display 150, a controller 160, a memory 170, and a key input receiver 180.

The broadcast receiver 110 tunes and modulates a broadcast received from an external source by wire or wireless. Here, the broadcast receiver 110 may receive the broadcast from an external device such as a broadcasting station, a satellite, etc., e.g., from a settop box.

The broadcast processor 120 performs signal processing including decoding, scaling, image processing, etc., on the broadcast output from the broadcast receiver 100.

The OSD combiner 130 overlaps OSD information including texts and/or graphics on a broadcast screen to be displayed. The OSD information includes "Input Number" and "Minor Channel List," and will be described in detail later.

The broadcast output unit 140 displays the broadcast screen overlapping with the OSD information on the display 150 such as a liquid crystal display (LCD).

The memory 170 may be a recording medium storing a program and data for operating the broadcast receiving apparatus. The data stored in the memory 170 may be "Channel Map."

The controller 160 controls an overall operation of the broadcast receiving apparatus according to a key input of a user which is transmitted from a remote controller 190 through the key input receiver 180. In detail, the controller 160 tunes a broadcast channel according to the key input of the user, and a method of tuning the broadcast channel will be described with reference to FIG. 3.

Figure 3:
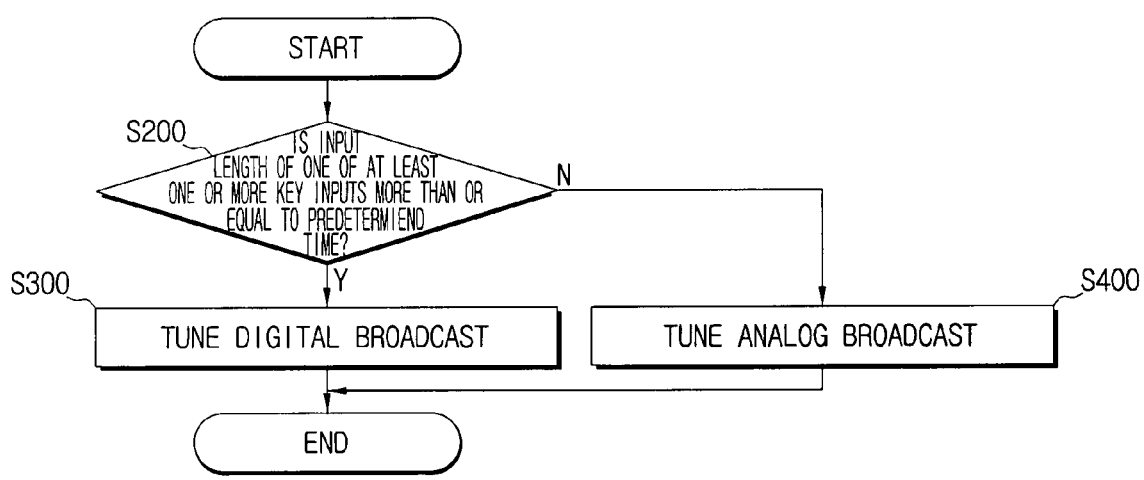
FIG. 3 is a flowchart of a tuning method according to an embodiment of the present invention.

FIG. 3 is a flowchart of a tuning method according to an embodiment of the present invention. Referring to FIG. 3, in operation S200, the controller 160 determines whether an input length of one of at least one or more key inputs is more than or equal to a predetermined time.

If it is determined in operation S200 that the input length is more than or equal to the predetermined time, the controller 160 controls the broadcast receiver 110 to tune a digital broadcast in operation S300. In detail, the controller 160 controls the broadcast receiver 110 to tune to a digital broadcast channel designated by at least one key input.

For example, if the number key "7" is input for a duration equal to or greater than a first predetermined time, the receiver 110 recognizes that the desired channel is a digital channel "7" or "7-1". If not, the receiver 110 recognizes that the desired channel is analog channel "7". Furthermore, if a number key "2" is subsequently input before the timeout period, the recognized channel may be digital channel "7-2" or analog channel "72" respectively. In this case, the controller 160 controls the broadcast receiver 110 to tune to the respective recognized channel.

As another example, a number key "1" is input for a duration shorter than the first predetermined time, the number key "2" is input for a duration greater than the first predetermined time, and the number key "1" is input for a duration shorter than the first predetermined time. In this case, the controller 160 controls the broadcast receiver 110 to tune a digital broadcast channel "12-1."

If it is determined in operation S200 that the input length of one of the at least one or more key inputs is less than the first predetermined time, the controller 160 controls the broadcast receiver 110 to tune an analog broadcast in operation S400. In detail, the controller 160 controls the broadcast receiver 110 to tune an analog broadcast channel designated by at least one key input.

For example, a when the number key "7" is input for a duration shorter than the first predetermined time, the controller 160 controls the broadcast receiver 110 to tune an analog broadcast channel "7."

As another example, when the number key "7" is input for a duration shorter than the first predetermined time and the number key "2" may is also input for a duration shorter than the first predetermined time, the controller 160 controls the broadcast receiver 110 to tune an analog broadcast channel "72."

A tuning method according to another embodiment of the present invention will now be described with reference to FIG. 4. As in the tuning method of FIG. 3, in the tuning method of FIG. 4, if an input length of one of at least one or more key inputs is more than or equal to a predetermined time, a digital broadcast is tuned, but an analog broadcast is tuned in other cases. Thus, operation S200 of FIG. 4 corresponds to operation S200 of FIG. 3, operations S310 and S320 of FIG. 4 correspond to operation S300 of FIG. 3, and operation S410 of FIG. 4 corresponds to operation S400 of FIG. 3.

Figure 4:
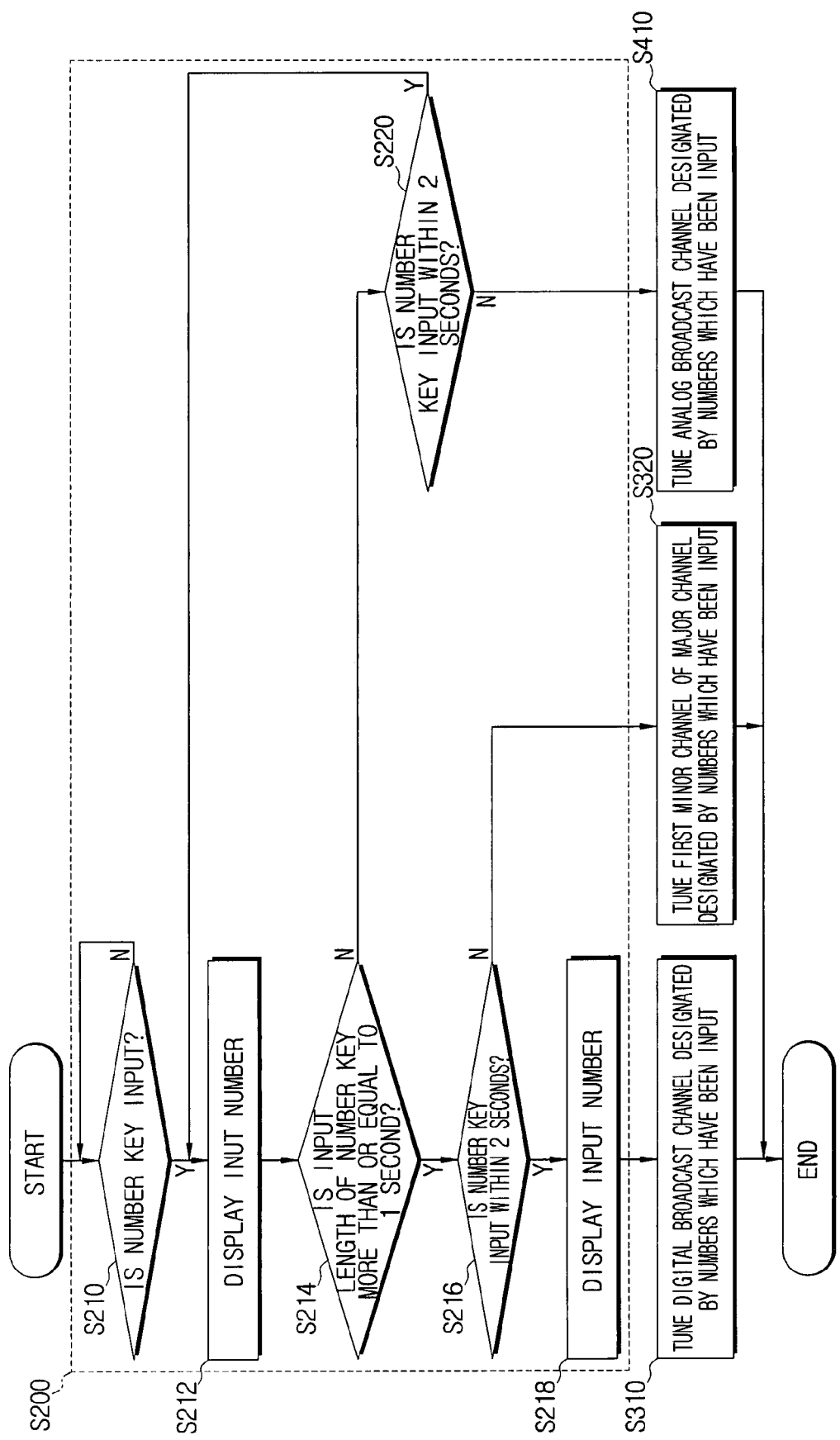
FIG. 4 is a flowchart of a tuning method according to another embodiment of the present invention.

Referring to FIG. 4, if a number key is input from a user through the remote controller 190 in operation S210, the controller 160 controls the OSD combiner 130 to overlap a number input through the number key as OSD information on a broadcast screen in operation S212.

In operation S214, the controller 160 determines whether an input length of the number key input in operation S210 is more than or equal to 1 second. If it is determined in operation S214 that the input length of the number key is more than or equal to one second, and if it is determined in operation S216 that a number key is input within a timeout period of two seconds after the number key is input in operation S210, the controller 160 controls the OSD combiner 130 to overlap a number input through the number key in operation S216 as OSD information on the broadcast screen in operation S218.

In operation S310, the controller 160 tunes a digital broadcast channel designated by the numbers which have been input through the number keys. In detail, in operation S310, the controller 160 controls the broadcast receiver 110 to tune a minor channel designated by the number input through the number key in operation S216, wherein the minor channel is one of minor channels belonging to a major channel.

For example, if it is determined in operation S214 that the number key "7" is input for one or more seconds in operation S210, and if it is determined in operation S216 that the number key "2" is input within two seconds, the controller 160 controls the broadcast receiver 110 to tune a digital broadcast channel "7-2" in operation S310.

If it is determined in operation S216 that the number key is not input within two seconds, in operation S320, the controller 160 controls the broadcast receiver 110 to tune a first minor channel of minor channels belonging to a major channel designated by the numbers which have been input through the number keys.

For example, if it is determined in operation S214 that the number key "7" is input for 1 or more seconds in operation S210, and if it is determined in operation S216 that the number key is not input within 2 seconds and a first minor channel of a major channel "7" is "1," the controller 160 controls the broadcast receiver 110 to tune a digital broadcast channel "7-1" in operation S320.

If it is determined in operation S214 that the number key is input for 1 or less second, in operation S220, the controller 160 determines whether a number key is input within 2 seconds after the number key is input in operation S210.

If it is determined in operation S220 that the number key is not input within 2 seconds, in operation S410, the controller 160 tunes to an analog broadcast channel designated by the numbers which has been input through the number keys. In detail, in operation S410, the controller 160 controls the broadcast receiver 110 to tune an analog broadcast channel designated by the number input through the number key in operation S210.

For example, if it is determined in operation S214 that the number key "7" is input for 1 or less second in operation in operation S210, and if it is determined that in operation S220 that the number key is not input within 2 seconds, the controller 160 controls the broadcast receiver 110 to tune an analog broadcast channel "7" in operation S410.

If it is determined in operation S214 that the number key is input for 1 or less in operation S210, and if it is determined in operation S220 that the number key is input within 2 seconds, the controller 160 returns to operation S212. Thus, a key may be input to tune a 2-figure or more major channel or a 2-figure or more analog broadcast channel.

For example, if it is determined in operation S214 that the number key "1" is input for 1 or less second in operation S210, if it is determined in operation S214 that the number key "2" is input for 1 or more seconds within 2 seconds, and if it is determined in operation S216 that the number key "2" is input within 2 seconds, the controller 160 controls the broadcast receiver 110 to tune a digital broadcast channel "12-2" in operation S310.

If it is determined in operation S214 that the number key "1" is input for 1 or less second in operation S210, if it is determined in operation S214 that the number key "2" is input for 1 or more seconds, if it is determined in operation S216 that the number key is not input within 2 seconds, and a first minor channel of a major channel "12" is "1," the controller 160 controls the broadcast receiver 110 to tune a digital broadcast channel "12-1" in operation S320.

If it is determined in operation S214 that the number key "7" is input for 1 or less second in operation S210, if it is determined in operation S214 that the number key "1" is input for 1 or less second within 2 seconds in operation S220, and if it is determined in operation S220 that the number key is not input within 2 seconds, the controller 160 controls the broadcast receiver 110 to tune an analog broadcast channel "71" in operation S410.

In an alternative method to select a channel, if the last digit of the major channel number is input for a period longer than a second predetermined time, the second predetermined time being longer than the first predetermined time, the receiver 110 may immediately tune to the first minor channel corresponding to the major channel number. The second predetermined time may be approximately two seconds. This method may be applied irrespective of whether the selected major channel has one or a plurality of selectable minor channels. Furthermore, the receiver may tune to a pre-designated channel instead of tuning to the first minor channel. Still, in another method to select a channel, if the currently selected major channel has a single minor channel, the tuning would be performed immediately to that single minor channel number. In this case, there would be no need for the receiver to wait for the timeout period or actuating the number key for a second predetermined time before initiating the tuning process. The checking of the availability of the minor channels may be performed by utilizing information which was stored during an automatic channel searching function or by utilizing the program information sent with the broadcast, such as the PSIP (Program system information protocol) of the U.S. digital television broadcast standard.

A tuning method according to another embodiment of the present invention will now be described with reference to FIG. 5. As in the tuning methods of FIGS. 3 and 4, in the tuning method of FIG. 5, if an input length of one of at least one or more key inputs is more than or equal to a predetermined time, a digital broadcast is tuned, but an analog broadcast is tuned in other cases. Thus, operations S200, S320, and S410 of FIG. 5 respectively correspond to operations S200, S300, and S400 of FIG. 3.

Figure 5:
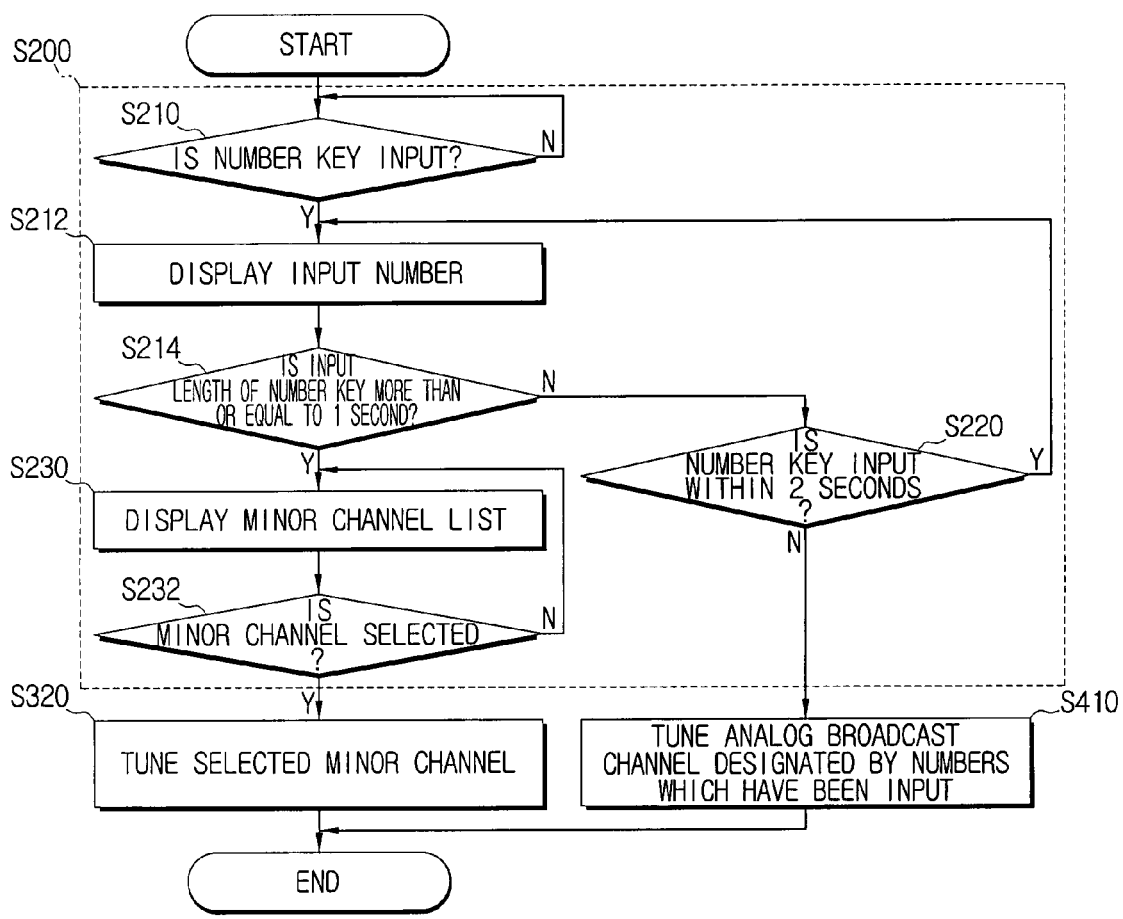
FIG. 5 is a flowchart of a tuning method according to another embodiment of the present invention.

Operations S210, S212, S214, S220, and S410 of FIG. 5 are the same as operations S210, S212, S214, S220, and S410 of FIG. 4, respectively, and thus their detailed descriptions will be omitted. Only operations S230, S232, and S320, which have not been described in FIG. 4, will be described.

Referring to FIG. 5, if it is determined in operation S214 that a number key is input for 1 or more seconds, the controller 160 controls the OSD combiner 130 to overlap and display a minor channel list as OSD information on a broadcast screen in operation S230.

Here, the minor channel list refers to a list including minor channels belonging to a major channel designated by numbers which have been input before operation S230. For example, if a number key "7" is input for 1 or more seconds before operation S230, the controller 160 displays a minor channel list of a major channel "7" in operation S230. As another example, if a number key "1" is input for 1 or less second and a number key "2" is input for 1 or more seconds before operation S230, the controller 160 displays a minor channel list of a major channel "12" in operation S230.

The controller 160 generates such a minor channel list with reference to a channel map including information related to channels stored in the memory 170.

Figure 6A:
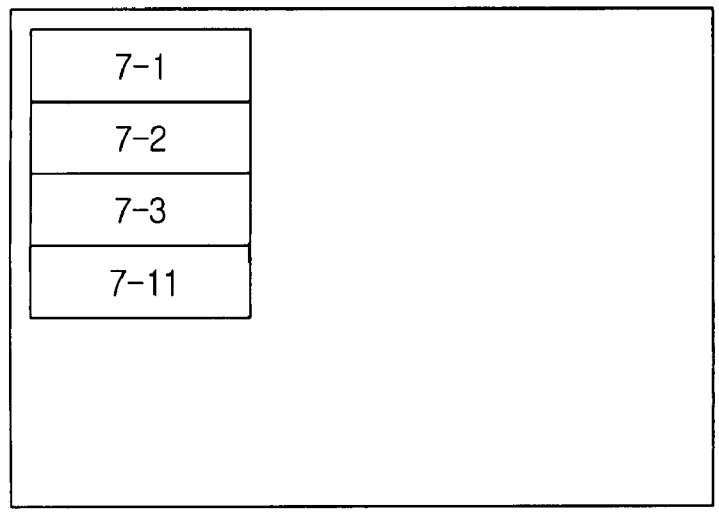
FIGS. 6A and 6B illustrate examples of a minor channel list.
Figure 6B:
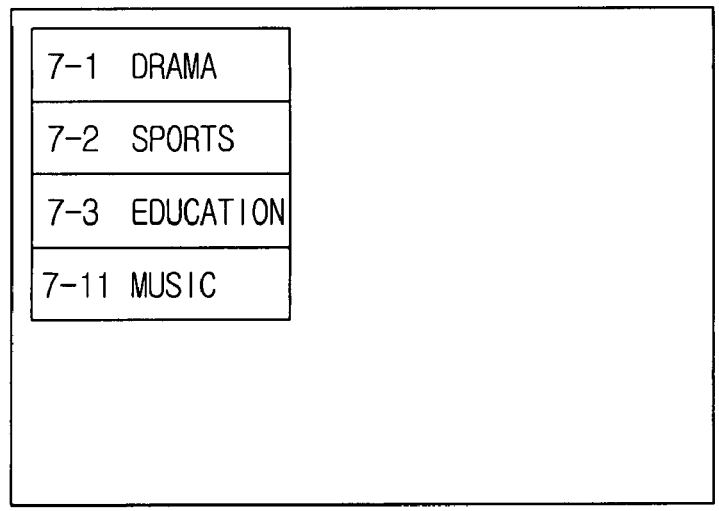

The controller 160 may arrange only channel numbers to generate the minor channel list or may arrange the channel numbers together with kinds of channels to generate the minor channel list. The former case is illustrated in FIG. 6A, and the latter case is illustrated in FIG. 6B.

Referring to FIG. 5 again, in operation S232, the controller 160 determines whether a user selects a minor channel through the remote controller 190.

Here, the user may select the minor channel using a direction and selection key or a number key provided in the remote controller 190 with reference to the minor channel list displayed in operation S230.

If it is determined in operation S232 that the user selects the minor channel, the controller 160 controls the broadcast receiver 110 to tune the selected minor channel in operation S320.

The tuning methods of tuning broadcasts using different methods according to a variable input length of a key input performed by a user have been described in detail in the embodiments of the present.

Times mentioned in the embodiments of the present invention, i.e., 1 second and 2 seconds, are only examples for convenience. Thus, other times may be used in the embodiments of the present invention.

Also, the remote controller 190 has been described as a user input unit for selecting a channel in the embodiments of the present invention. However, other key input units, e.g., a key input unit provided on a front panel of a broadcast receiving apparatus or the like, may be used.

In addition, in the embodiments of the present invention, if an input length of one of at least one or more key inputs is more than or equal to a predetermined time, a digital broadcast is tuned, but an analog broadcast is tuned in other cases. However, an opposite case may be realized.

In other words, if an input length of one of at least one or more key inputs is more than or equal to a predetermined time, an analog broadcast may be tuned, but a digital broadcast may be tuned in other cases.

It has been described in the present embodiments of the present invention that a digital or analog broadcast is tuned according to a variable input length of a key input performed by a user. However, this is only an example for convenience. Thus, broadcasts using different methods may be tuned according to a variable input length of a key input performed by a user.

For example, the scope of the present invention may be applied if a terrestrial broadcast or a cable broadcast is tuned according to a length of a key input performed by a user, if a terrestrial broadcast or a satellite broadcast is tuned according to a length of a key input performed by a user, and if a cable broadcast or a satellite broadcast is tuned according to a length of a key input performed by a user. Thus, the present invention may be applied whenever there is a potential for a conflict in channel designations (i.e. using the same channel designation) between the different types of broadcasts.

The broadcast receiving apparatus of the present invention illustrated in FIG. 2 does not need to include all of blocks illustrated in FIG. 2, and thus unnecessary blocks may be omitted. For example, if the broadcast receiving apparatus is a settop box, the broadcast receiving apparatus may not include the display 150.

As described above, according to the present invention, broadcasts using different methods can be tuned according to a length of a key input performed by a user. Thus, a digital broadcast channel can be directly input using only a number key without an additional key.

Also, an additional key used only for inputting a digital broadcast channel is not needed. Thus, the size and the complexity of the a remote controller can be decreased, and the user can easily input a broadcast channel through the remote controller.

The process of inputting channel designations as described above is not limited to channel numbers, but may be applied to other types of channel designations such as alphabetical and/or special symbols.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A tuning method comprising:
   conducting a first tuning to a channel of a first type broadcast corresponding to a number key of one or more number keys if it is determined that an input time period of the number key of the one or more number keys is greater than or equal to a first predetermined time period; and
   conducting a second tuning to a channel of a second type broadcast corresponding to the number key of the one or more number keys if it is determined that the input time period of the number key is less than the first predetermined time period,
   wherein the first tuning comprises tuning to a major channel corresponding to a first number which is input through the number key in which the number key is activated for the input time period which is greater than or equal to the first predetermined time period.

2. The tuning method of claim 1, wherein the first type broadcast comprises a digital broadcast.

3. The tuning method of claim 2, wherein the first tuning comprises tuning to one of minor channels of the major channel, which corresponds to a second number input through at least one of the number keys after the input of the first number.

4. The tuning method of claim 2, wherein the first tuning comprises tuning to a major channel which corresponds to a combination of a plurality of keys corresponding to a plurality of digits in which a key of the number keys corresponding to the last digit of the plurality of digits is activated for the input time period which is greater than or equal to the first predetermined time period.

5. The tuning method of claim 4, wherein the first tuning comprises tuning to one of minor channels of the major channel, which corresponds to a second number input through at least one number key of the number keys, after the input of the first number.

6. The tuning method of claim 2, wherein the second type broadcast comprises an analog broadcast.

7. The tuning method of claim 2, wherein the first tuning comprises selecting from a list of minor channels in a screen to be displayed, wherein the minor channels belong to a major channel.

8. The tuning method of claim 7, wherein the list of minor channels comprises of at least a channel number and a channel name.

9. The tuning method of claim 1, wherein the first type broadcast comprises one of terrestrial, cable, IPTV and satellite broadcasts, the second type broadcast comprises one of terrestrial, cable, and satellite broadcasts, and the first and the second type broadcast are different from each other.

10. The tuning method of claim 2, wherein a broadcast corresponding to a predetermined minor channel number of the major channel number is tuned if a timeout period elapses after the input of the first number by the user, the first number corresponding to the major channel number.

11. The tuning method of claim 10, wherein the predetermined minor channel number is the first minor channel number of the corresponding major channel number.

12. The tuning method of claim 2, wherein a broadcast corresponding to a predetermined minor channel number of the major channel number is tuned if the number key corresponding to the first number is input for a second predetermined time period.

13. The tuning method of claim 12, wherein the second predetermined time period is greater than the first predetermined time period.

14. The tuning method of claim 2, wherein the first predetermined time period is approximately one second.

15. The tuning method of claim 14, wherein the second predetermined time period is approximately two seconds.

16. The tuning method of claim 12, wherein the predetermined minor channel number is the first minor channel number of the corresponding major channel number.

17. The tuning method of claim 12, wherein the second predetermined time period is approximately two seconds.

18. The tuning method of claim 10, wherein the timeout period is approximately two seconds.

19. The tuning method of claim 1, wherein the tuning method is incorporated into a settop box.

20. The tuning method of claim 1, wherein the tuning method is incorporated into a television.

21. The tuning method of claim 2, wherein the first broadcast type is an IPTV broadcast and the second broadcast type is a digital broadcast type.

22. The tuning method of claim 21, wherein the second broadcast type is a terrestrial broadcast.

23. The tuning method of claim 2, wherein the first broadcast type is a terrestrial broadcast and the second broadcast type is a cable broadcast.

24. A broadcast receiving apparatus comprising:
a broadcast receiver which tunes to and receives a broadcast; and
a controller which controls the broadcast receiver such that a channel of a first type broadcast corresponding to a number key of one or more number keys is tuned, if it is determined that an input time period of the number key of the one or more number keys is greater than or equal to a first predetermined time period, and a channel of a second type broadcast corresponding to the number key of the one or more number keys is tuned, if it is determined that the input time period of the number key is less than the first predetermined time period, wherein the second type broadcast is different from the first type broadcast,
wherein the tuning of the channel of the first type broadcast comprises tuning to a major channel corresponding to a first number which is input through the number key in which the number key is activated for the input time period which is greater than or equal to the first predetermined time period.

25. The broadcast receiving apparatus of claim 24, wherein the first type broadcast comprises a digital broadcast.

26. The broadcast receiving apparatus of claim 25, wherein the controller controls the broadcast receiver to tune to one of minor channels of the major channel, which corresponds to a second number input through at least one of the number keys after the input of the first number.

27. The broadcast receiving apparatus of claim 25, wherein the first tuning comprises tuning to a major channel which corresponds to a combination of a plurality of keys corresponding to a plurality of digits in which a key corresponding to the last digit of the plurality of digits is activated for a time period greater than or equal to the first predetermined time period.

28. The broadcast receiving apparatus of claim 27, wherein the controller controls the broadcast receiver such that one of minor channels of the major channel, which corresponds to a second number input through at least one number key of the number keys, after the input of the first number is tuned.

29. The broadcast receiving apparatus of claim 25, wherein the second type broadcast comprises an analog broadcast.

30. The broadcast receiving apparatus of claim 25, further comprising a combiner which processes such that a display information is overlapped on a screen to be displayed, and
the controller controls the combiner such that the length of the key input time is overlapped on the screen, when the screen displays a list of minor channels belonging to the major channel corresponding to a number input through the number key for the time period which is greater than or equal to the predetermined time period.

31. The broadcast receiving apparatus of claim 30, wherein the controller controls the broadcast receiver such that a minor channel, which is selected by a user from the list of minor channels, is tuned.

32. The broadcast receiving apparatus of claim 24, wherein the first type broadcast comprises one of terrestrial, cable, and satellite broadcasts, the second type broadcast comprises one of terrestrial, cable, and satellite broadcasts, and the first and the second type broadcast are different from each other.

33. A tuning method comprising:
receiving an input of a first number key of one or more number keys for a time period which is greater than or equal to a predetermined time period;
displaying a minor channel list including minor channels belonging to a major channel corresponding to a first number input through the first number key in response to the receiving of the input of the first number key for the time period which is greater than or equal to the predetermined time period;
receiving an input of a second number key of the one or more number keys after the input of the first number key; and
tuning a minor channel corresponding to a second number input through the second number key, wherein the minor channel is selected from the minor channels.

34. A tuning method comprising:
- determining a length of input time of a number key of one or more number keys;
- determining the input of the number key as a command to tune to a channel of a first type broadcast corresponding to the number key, if it is determined that the length of the input time of the number key is greater than or equal to a predetermined time period; and
- determining the input of the number key as a command to tune to a channel of a second type broadcast corresponding to the number key, the second type broadcast being different from the first type broadcast, if it is determined that the length of the input time of the number key is less than the predetermined time period,
- wherein the channel of the first type broadcast corresponds to a major channel and the channel of the second type broadcast corresponds to a miner channel.

35. The tuning method of claim 34, wherein the first type broadcast comprises a digital broadcast, and the second type broadcast comprises an analog broadcast.

36. A tuning method comprising:
- determining a length of time that a first key of one or more keys is input;
- determining that the first key input is for inputting a major channel and displaying a minor channel list including minor channels belonging to a major channel corresponding to the first key, if it is determined that the first key is input for a time period which is greater than or equal to a predetermined time period; and
- tuning a minor channel corresponding to a second key of the one or more keys, wherein the minor channel is selected from the minor channels.

37. The tuning method according to claim 36, wherein the key input is a numerical input.

38. The tuning method according to claim 37, wherein the key input is a alphabetical character input.

39. A tuning method comprising:
- determining whether an input length of a first number key is greater than or equal to a first predetermined time period; and
- displaying a major channel number corresponding to a number which is input through the first number key and a dash (-) key, if it is determined that the input length of the first number key is greater than or equal to the first predetermined time period.

40. The tuning method of claim 39, further comprising:
- displaying a minor channel number corresponding to a second number key besides the major channel number and the dash (-) key, if the second number key is input within a second predetermined time period after the first number key is input; and
- tuning a channel corresponding to the major channel which corresponds to the first number key and the minor channel which corresponds to the second number key.

41. The tuning method of claim 39, further comprising:
- tuning a representative minor channel fixed to a first minor channel of the major channel or a default channel among minor channels of the major channel, if any number key is not input within the second predetermined time period after the first key is input.

42. A broadcast receiving apparatus comprising:
- a display unit; and
- a controller for controlling to display a major channel number corresponding to a number which is input through a first key and a dash (-) key, if an input length of the first key is greater than or equal to a first predetermined time period.

43. The broadcast receiving apparatus of claim 42, wherein the controller controls to display a minor channel number corresponding to a second number key besides the major channel number and the dash (-) key, if the second number key is input within a second predetermined time period after the first number key is input and to tune a channel corresponding to the major channel which corresponds to the first number key and the minor channel which corresponds to the second number key.

44. The broadcast receiving apparatus of claim 42, wherein the controller controls to tune a representative minor channel fixed to a first minor channel of the major channel or a default channel among the minor channels of the major channel, if any number key is not input within the second predetermined time period after the first number key is input.

* * * * *